United States Patent
Hynecek

(10) Patent No.: US 9,456,157 B2
(45) Date of Patent: Sep. 27, 2016

(54) IMAGE SENSOR PIXELS HAVING P-CHANNEL SOURCE FOLLOWER TRANSISTORS AND INCREASED PHOTODIODE CHARGE STORAGE CAPACITY

(71) Applicant: SEMICONDUCTOR COMPONENTS INDUSTRIES, LLC, Phoenix, AZ (US)

(72) Inventor: Jaroslav Hynecek, Allen, TX (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/553,829

(22) Filed: Nov. 25, 2014

(65) Prior Publication Data

US 2016/0150169 A1    May 26, 2016

(51) Int. Cl.
| | |
|---|---|
| H04N 5/335 | (2011.01) |
| H01L 27/148 | (2006.01) |
| H04N 5/374 | (2011.01) |
| H01L 27/146 | (2006.01) |
| H01L 29/808 | (2006.01) |
| H04N 5/378 | (2011.01) |

(52) U.S. Cl.
CPC .......... *H04N 5/374* (2013.01); *H01L 27/1461* (2013.01); *H01L 27/1463* (2013.01); *H01L 27/14603* (2013.01); *H01L 27/14612* (2013.01); *H01L 27/14641* (2013.01); *H01L 27/14645* (2013.01); *H01L 27/14679* (2013.01); *H01L 29/808* (2013.01); *H04N 5/378* (2013.01); *H01L 27/14621* (2013.01); *H01L 27/14627* (2013.01)

(58) Field of Classification Search
CPC ...... H04N 5/357; H04N 5/359; H04N 5/363; H01L 29/808
See application file for complete search history.

(56) References Cited

U.S. PATENT DOCUMENTS

| | | |
|---|---|---|
| 5,625,210 A | 4/1997 | Lee et al. |
| 6,952,004 B2 | 10/2005 | Henderson |
| 8,084,796 B2 * | 12/2011 | Mori ................. H01L 27/14609 257/223 |
| 8,159,011 B2 | 4/2012 | Hynecek |
| 8,471,310 B2 | 6/2013 | Hynecek |
| 8,558,931 B2 | 10/2013 | Hynecek |
| 8,610,046 B2 | 12/2013 | Van Blerkom |
| 8,710,420 B2 | 4/2014 | Hynecek |
| 2007/0218579 A1 * | 9/2007 | Lee ................... H01L 27/14603 438/48 |

(Continued)

OTHER PUBLICATIONS

Hynecek, U.S. Appl. No. 14/183,042, filed Feb. 18, 2014.

*Primary Examiner* — Aung S Moe
*Assistant Examiner* — John H Morehead, III
(74) *Attorney, Agent, or Firm* — Treyz Law Group, P.C.; Michael H. Lyons

(57) ABSTRACT

An image sensor may include image sensor pixels formed on a substrate. Each pixel may have a photodiode, a floating diffusion node, and charge transfer gate. The pixel may include an n-type doped well region and a p-channel MOS source follower transistor formed within the n-well region. An n-channel MOS reset transistor may be coupled between the floating diffusion region and a bias voltage column line and may have a drain terminal that overlaps with the n-well region. If desired, the pixel may include a p-channel JFET source follower transistor formed within the floating diffusion region on the substrate and an n-channel MOSFET reset transistor coupled to the floating diffusion. The polarities of the doping in the substrate on which the pixels are formed may be reversed. The pixel may be formed without row select transistors to increase photodiode area and charge storage capacity.

18 Claims, 8 Drawing Sheets

(56) References Cited

U.S. PATENT DOCUMENTS

| | | | | |
|---|---|---|---|---|
| 2009/0219422 A1* | 9/2009 | Takeuchi | ......... | H01L 27/14603 348/300 |
| 2013/0056619 A1* | 3/2013 | Shinohara | ............ | H04N 5/3741 250/208.1 |
| 2013/0146747 A1 | 6/2013 | Hynecek | | |
| 2013/0277534 A1* | 10/2013 | Watanabe | ......... | H01L 27/14806 250/208.1 |
| 2013/0320196 A1* | 12/2013 | Hirosige | ........... | H01L 27/14643 250/208.1 |
| 2014/0085523 A1 | 3/2014 | Hynecek | | |
| 2015/0172579 A1* | 6/2015 | Manabe | ................. | H04N 5/378 250/208.1 |
| 2015/0349001 A1* | 12/2015 | Wang | .................. | H01L 27/1463 257/443 |

* cited by examiner

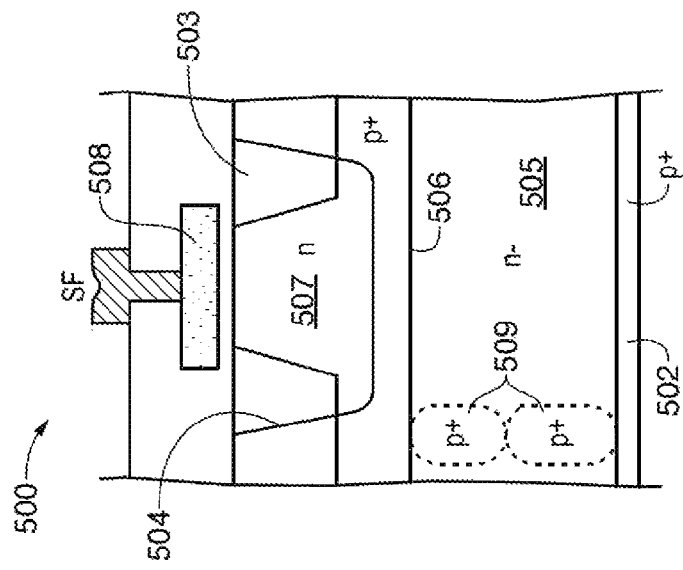
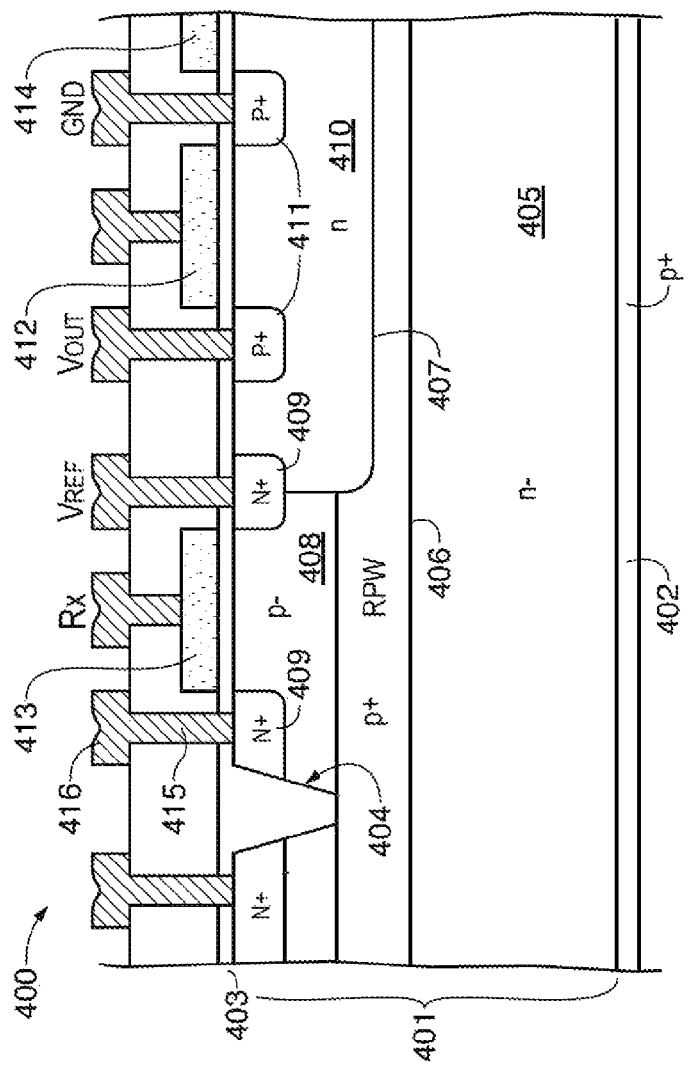

IMAGE SENSOR PIXELS HAVING P-CHANNEL SOURCE FOLLOWER TRANSISTORS AND INCREASED PHOTODIODE CHARGE STORAGE CAPACITY

BACKGROUND

This relates to solid-state image sensor arrays (e.g., complementary metal-oxide-semiconductor (CMOS) arrays) and, more specifically, to image sensors with pixels that can have submicron sizes and can be illuminated from the back side or the front side of a pixel substrate on which the pixels are formed. The small (i.e., less than 1 micron) size of the pixels reduces the cost of the image sensor arrays, but it is important not to sacrifice sensor performance such as noise, pixel well capacity, dynamic range, blooming control, low dark current contributions, and negligible image lag despite the decreased pixel size.

Typical image sensors sense light by converting impinging photons into electrons (or holes) that are integrated (collected) in sensor pixels. Upon completion of each integration cycle, the collected charge is converted into voltage signals, which are supplied to corresponding output terminals associated with the image sensor. Typically, the charge-to-voltage conversion is performed directly within the pixels, and the resulting analog pixel voltage signals are transferred to the output terminals through various pixel addressing and scanning schemes. The analog voltage signal can sometimes be converted on-chip to a digital equivalent before being conveyed off-chip. Each pixel includes a buffer amplifier (i.e., source follower) that drives output sensing lines that are connected to the pixels via respective address transistors.

After the charge-to-voltage conversion is completed and after the resulting signals are transferred out from the pixels, the pixels are reset before a subsequent integration cycle begins. In pixels that include floating diffusions (FD) serving as the charge detection node, this reset operation is accomplished by momentarily turning on a reset transistor that connects the floating diffusion node to a voltage reference (typically the pixel current drain node) for draining (or removing) any charge transferred onto the FD node. However, removing charge from the floating diffusion node using the reset transistor generates thermal kTC-reset noise, as is well known in the art. This kTC reset noise must be removed using correlated double sampling (CDS) signal processing techniques in order to achieve desired low noise performance. Typical CMOS image sensors that utilize CDS require at least four transistors (4T) per pixel. An example of the 4T pixel circuit with a pinned photodiode can be found in Lee (U.S. Pat. No. 5,625,210), incorporated herein as a reference.

FIG. 1 shows a simplified circuit diagram of a pixel 100 in a CMOS sensor. Pixel circuit 100 has a two-way shared photodiode scheme in which two photodiodes share a single floating diffusion node. In particular, photodiodes 101 (PD1) and 102 (PD2) share common floating diffusion (FD) charge detection node 114 to which source follower (SF) transistor 103 is connected. The drain terminal of source follower transistor 103 is connected to Vdd column bias line 1.09 and the source terminal of source follower transistor 103 is connected to column output signal (readout) line 108 through addressing transistor 104. Charge detection node 114 is reset by reset transistor 105, which is also connected to Vdd column bias line 109. Charge from photodiodes 101 and 102 is transferred onto floating diffusion node 114 by charge transfer transistors 106 and 107, respectively. Reset transistor gate 105 is controlled by reset control signals received over row control line 110, charge transfer transistor gates 106 and 107 are controlled by transfer control signals received over row lines 112 and 113, respectively, and addressing transistor gate 104 is controlled by row select control signals received over row addressing line 111. As shown in FIG. 1, it is clear that each pair of pixel photodiodes must be coupled to it total of five transistors (i.e., 2.5 transistors per photodiode).

When the pixel size is reduced, it is desirable to minimize the number of transistors and the number of metal wire interconnections per pixel. This is typically accomplished by eliminating row addressing transistor 104. The operation of a pixel without the row addressing transistor is described, for example, in Hynecek (U.S. Pat. No. 8,558,931), incorporated herein by reference. When pixel components such as the source follower transistor are reduced in size, random telegraph signal (RTS) noise becomes more dominant and noticeable in the final image.

It would therefore be desirable to be able to provide improved image sensor pixels.

BRIEF DESCRIPTION OF THE DRAWINGS

FIG. 4 is an illustrative cross sectional diagram of a pixel of the type shown in FIGS. 2 and 3 as taken along line A"-A" of FIG. 3, where a mini n-well region is formed with a p-channel MOSFET source follower transistor. A connection is provided between a mini n-well and an n+ type doped MOSFET reset transistor source. A p+ type doped RPW layer is provided in accordance with an embodiment of the present invention.

FIG. 5 is an illustrative cross sectional diagram of a pixel of the type shown in FIGS. 2 and 3 as taken across the STI isolated trunk at the location of the p-channel MOSFET source follower transistor in the pixel in accordance with an embodiment of the present invention.

DETAILED DESCRIPTION

Figure 1:
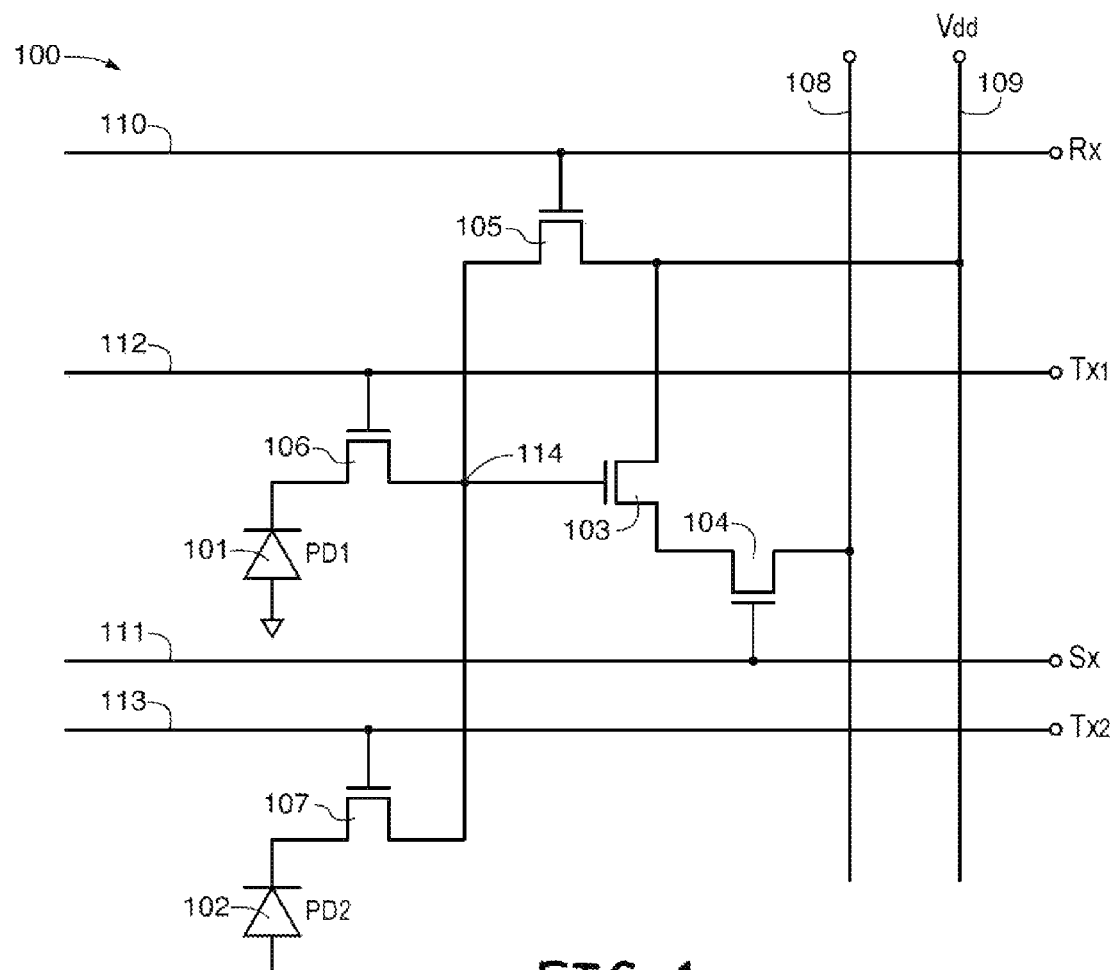
FIG. 1 is a simplified circuit diagram of a conventional image sensor pixel having two photodiodes sharing the same pixel circuitry which includes two transfer gates, a metal-oxide-semiconductor field-effect transistor (MOSFET) source follower, an addressing transistor, and a reset transistor.
Figure 2:
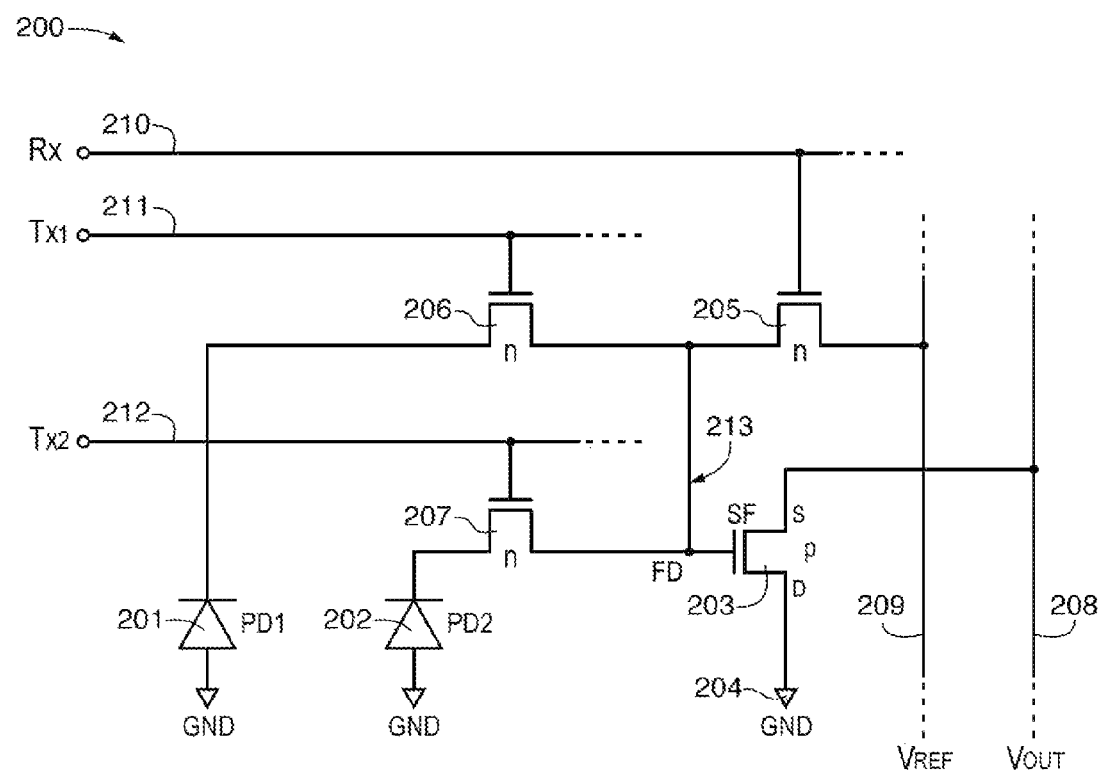
FIG. 2 is an illustrative circuit diagram of an image sensor pixel having two photodiodes that share a common floating diffusion region, having two charge-transfer transistors, a source follower transistor, and a reset transistor, where the source follower transistor is a p-channel type transistor in accordance with an embodiment of the present invention.

A simplified circuit diagram of an illustrative image sensor pixel having two photodiodes with corresponding charge transfer gates that share a common floating diffusion node is shown in FIG. 2. As shown in FIG. 2, pixel circuit 200 may include a first photodiode 201 (PD1) and a second photodiode 2202 (PD2) that share the same floating diffusion node 213 (sometimes referred to herein as charge storage node 213, charge storage region 213, floating diffusion 213, floating diffusion region 213, or floating diffusion junction region 213). This example is merely illustrative and, if desired, pixel 200 may include any desired number of photodiodes sharing a common charge detection circuit (e.g., four or more photodiodes). Pixel 200 may include source follower (SF) transistor 203 having a gate terminal coupled to floating diffusion node 213. Source follower transistor 203 may be a p-channel MOSFET (e.g., a MOSFET transistor having a p- type doped channel region. The drain of source follower 204 may be coupled to ground (GND) terminal 204, whereas the source terminal of source follower transistor 204 is connected to column signal line 208 common (e.g., a column readout line shared by all pixels in the corresponding column of the pixel array).

Charge detection node 213 may be reset by n-channel MOSFET transistor 205 (e.g., a MOSFET having an n- type doped channel region) that is coupled to column reference bias line 209 (e.g., on which vias voltage Vref is asserted). Charge from the photodiodes 201 and 202 is transferred onto floating diffusion node 213 by charge transferring transistors 206 and 207, respectively. Reset transistor gate 205 may receive reset control signals from row control circuitry (not shown for the sake of simplicity) over row reset line 210. Charge transfer transistor gates 206 and 207 may receive charge transfer control signals from the row control circuitry over row control lines 211 and 212, respectively. In the example of FIG. 2, no row addressing transistor (e.g., row select transistor) or corresponding row select control line is formed (e.g., thereby conserving space in the pixel). It is thus clear that each pair of two photodiodes contain a total of 4 transistors, 2 transistors per pixel PD. This results in a considerable saving of valuable pixel area when compared to conventional image pixels, which can then be allocated to photodiodes resulting in increased charge storage capacity.

The robustness of operation of this pixel arrangement stems from the fact that all the non-addressed row pixels have their reset transistors 205 constantly turned ON and only the addressed row pixels have the reset transistors turned OFF. This causes all the overflow charge from the non-addressed pixels to be safely drained onto the reset voltage reference bias line 209 and out from the array to the associated power supply. There cannot be any interference with the addressed pixel signal. In addition, when the reset transistor 205 is turned OFF, the gate to drain capacitive coupling of this transistor causes a small feed through signal to be input onto floating diffusion charge detection node 213. This turns source follower transistors 203 of the addressed pixel row ON and provides a safe operating margin between the addressed source follower transistors 203 and the non-addressed source follower transistors 203 in the same column. The resulting output signal is then ready to be sampled as a reference for a correlated double sampling (CDS) operation. When the photo-generated signal charge is transferred onto floating diffusion nodes 213 of the addressed row, the voltage margin between the non-addressed source follower transistors gates 203 and the addressed source follower transistor gates 203 increases by a greater amount, such that no interference with the non-addressed lines can occur even for signals with relatively high magnitudes.

Figure 3:
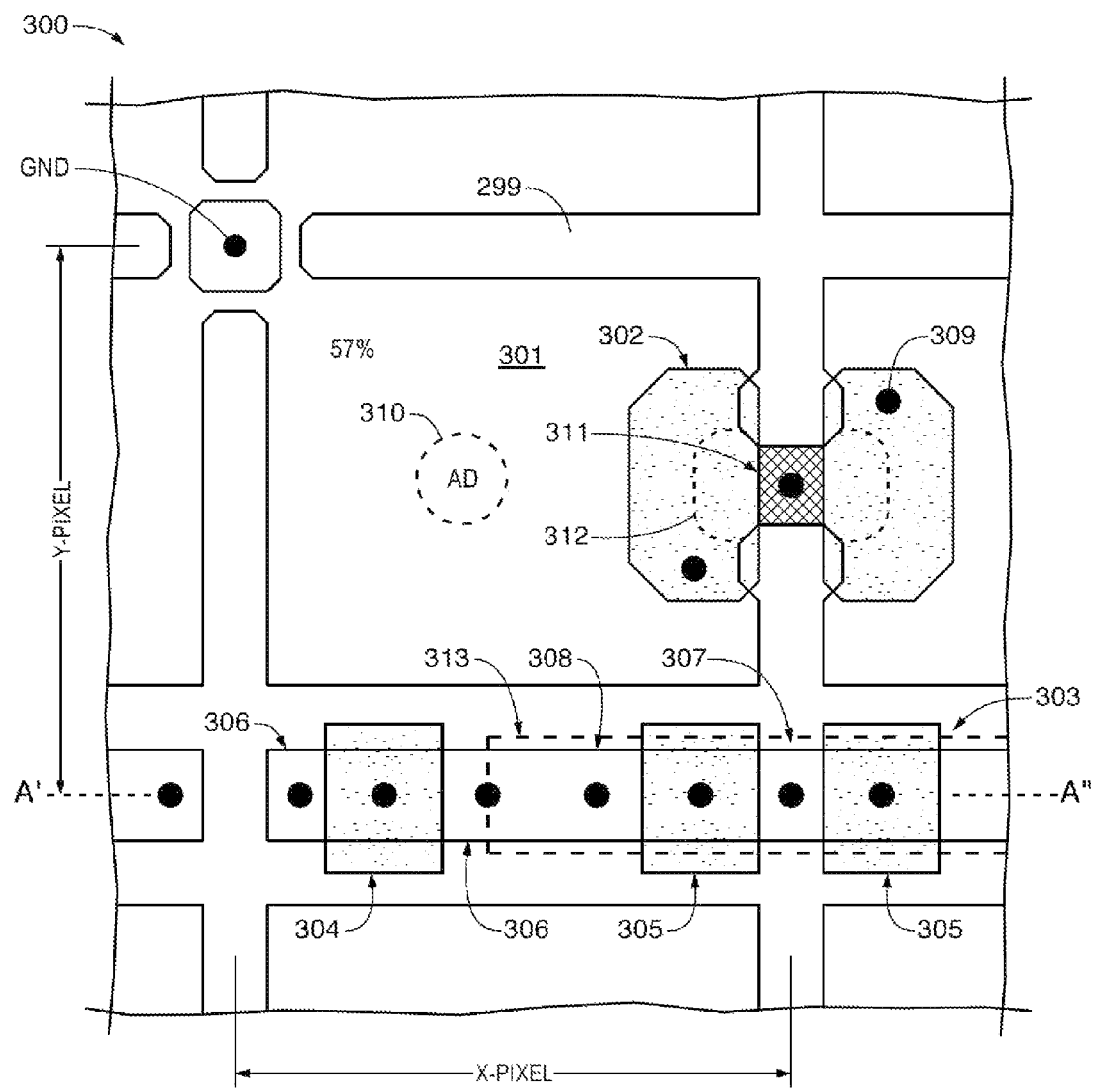
FIG. 3 is an illustrative layout diagram of two photodiodes with corresponding transfer gates per shared floating diffusion region pixel topology (e.g., a pixel having the circuit of the type shown in FIG. 2), in which the p-channel MOSFET source follower transistor and the n-channel MOSFET reset transistor are located in an shallow trench isolation (STI) trunk between photodiode rows in accordance with an embodiment of the present invention.

FIG. 3 is an example of an illustrative layout diagram for the topology of pixel circuit 200 having a p-channel MOSFET source follower transistor 203 and a 2-photodiode shared configuration. As shown by FIG. 3, pixel 300 (corresponding to pixel circuit 200 of FIG. 2) may have an active photodiode portion as shown by region 301 (e.g., corresponding to photodiode 201 or 202 of FIG. 2). Photodiode region 301 may include anti-dome (AD) implant and RPW compensating opening region 310 located approximately in the center of the pixel 300. Photodiode region 301 is isolated from the similar regions of the neighboring pixels by the STI regions 299. This example is merely illustrative and, if desired, other types of pixel isolation such as suitable implants or deep trench isolation (DTI) may be used. The charge transfer gate is shown by region 302 (corresponding to gate 206 or 207 of FIG. 2) that interfaces with the n+ type doped floating diffusion region 311 (corresponding to node 213). Transfer gate 302 may have a region 312 implanted underneath, which forms the charge well that improves charge transfer efficiency for the pixel. The mask opening for the implantation of a mini n-well region is indicated by a dashed line 313. Mini n-well region may be a lightly n- type doped region in the pixel substrate and may sometimes be referred to herein as a mini miniature n-well, or simply as the n-well of the pixel. The reset transistor and the SF transistor may be placed in the STI isolated trunk region 303 of pixel 300. The p+ type doped MOSFET source follower transistor source and drain are shown by regions 307 and 308 respectively. The region 307 is connected to pixel ground. The MOSFET source follower transistor gate is shown by region 305 (corresponding to source follower 203 of FIG. 2). Similarly the n-channel MOSFET reset transistor has n+ type doped source and drain regions 306 and a corresponding gate region 304 (e.g., corresponding to reset transistor 205). The pixel wiring has been omitted for the sake of simplicity, whereas the placement of contact via 309 to the pixel active regions is indicated as dark circles.

In another suitable arrangement, transfer gate region 302 may be enlarged in the direction perpendicular to the direction of charge transfer. In this scenario, charge transfer well 312 may be enlarged in order to hold more charge therein. Employing this well in the transfer gate design improves the floating diffusion voltage swing margin. An example of this type of improvement is explained for an n-channel type source follower pixel in Hynecek (U.S. Pat. No. 8,159,011), which is incorporated here as a reference. This version of the design, however, sacrifices some of the photodiode charge storage well capacity. In yet another suitable arrangement, circuits may be shared between the photodiodes located in neighboring rows of the array instead of neighboring photodiodes of the same row as is shown in FIG. 3.

FIG. 4 is an illustrative cross sectional diagram of a pixel of the type shown in FIGS. 2 and 3. As shown in FIG. 4, a cross sectional view is taken through line A'-A" of FIG. 3. Pixel 400 (corresponding to pixel circuit 200 of FIG. 2 and pixel topology 300 of FIG. 3) may be formed on substrate 401 having as p+ type doped layer 402 deposited on its back surface to minimize the interface state generated dark current. Epitaxial layer 405 can be either p− type or n− type lightly doped, for example. The substrate is covered by oxide layer 403 that isolates the transistor gates from the substrate. This layer also extends into STI isolation region 404 (e.g., corresponding; to region 299 of FIG. 3), P+ type doped RPW region 406 may provide a barrier for electrons that diverts the flow of the electrons into the photodiode storage well (not shown for the sake of simplicity). Region 406 may isolate the mini n-well region 407 from the substrate. Another important function of RPW layer 407 is to increase the charge storage capacity of the photodiode. Layer 407, however, requires an opening (e.g., AD region 310 as shown in FIG. 3) to allow the bulk generated electrons, for example in the region 405, to flow into the storage well of the photodiode.

N+ type doped regions 409 form the source and the drain terminals of the corresponding n-channel MOSFET reset transistor. One of the regions 409 (the drain) also provides a bias connection to mini n-well region 407, which may be completely depleted or only partially depleted of mobile charge. The gate of the n-channel MOSFET reset transistor is shown by region 413. The p-channel MOSFET source follower transistor is formed by the p+ type doped source 411 and the p+ type doped drain 410. The drain of the MOSFET source follower transistor is connected to ground or to p+ type doped substrate regions that isolate the pixels from each other (not shown for the sake of simplicity). The gate of the p-channel MOSFET source follower transistor is shown by region 412 (corresponding to source follower gate 203 of FIG. 2). The substrate and the gates are covered by inter-level oxide layers that are used for isolation of various metal layer interconnections. Only a single layer 414 and only the metal via 416 filling the contact holes 415 are shown for the sake of simplicity.

FIG. 5 shows a simplified cross sectional side view 500 of the pixel cut across the trunk at the place of the p-channel MOSFET source follower transistor (e.g., transistor 203). The substrate 501 includes p+ type doped layer 502 that is used for the reduction of interface states generated dark current. The gate oxide isolation layer is shown by region 503 that also fills STI region 504. The n− type or the p− type lightly doped epitaxial layer is shown by region 505. The p+ type doped mini n-well isolation RPW region is shown by layer 506 and the mini n-well that contains the p-channel MOSFET source follower transistor is shown by region 507. The gate of the p-channel MOSFET source follower transistor is shown by region 508. Pixel isolation is accomplished using p+− type doped regions 509, which can be located under STI region 504 or alternatively positioned directly in the middle under the transistor trunk (not shown in the example of FIG. 5).

Figure 6:
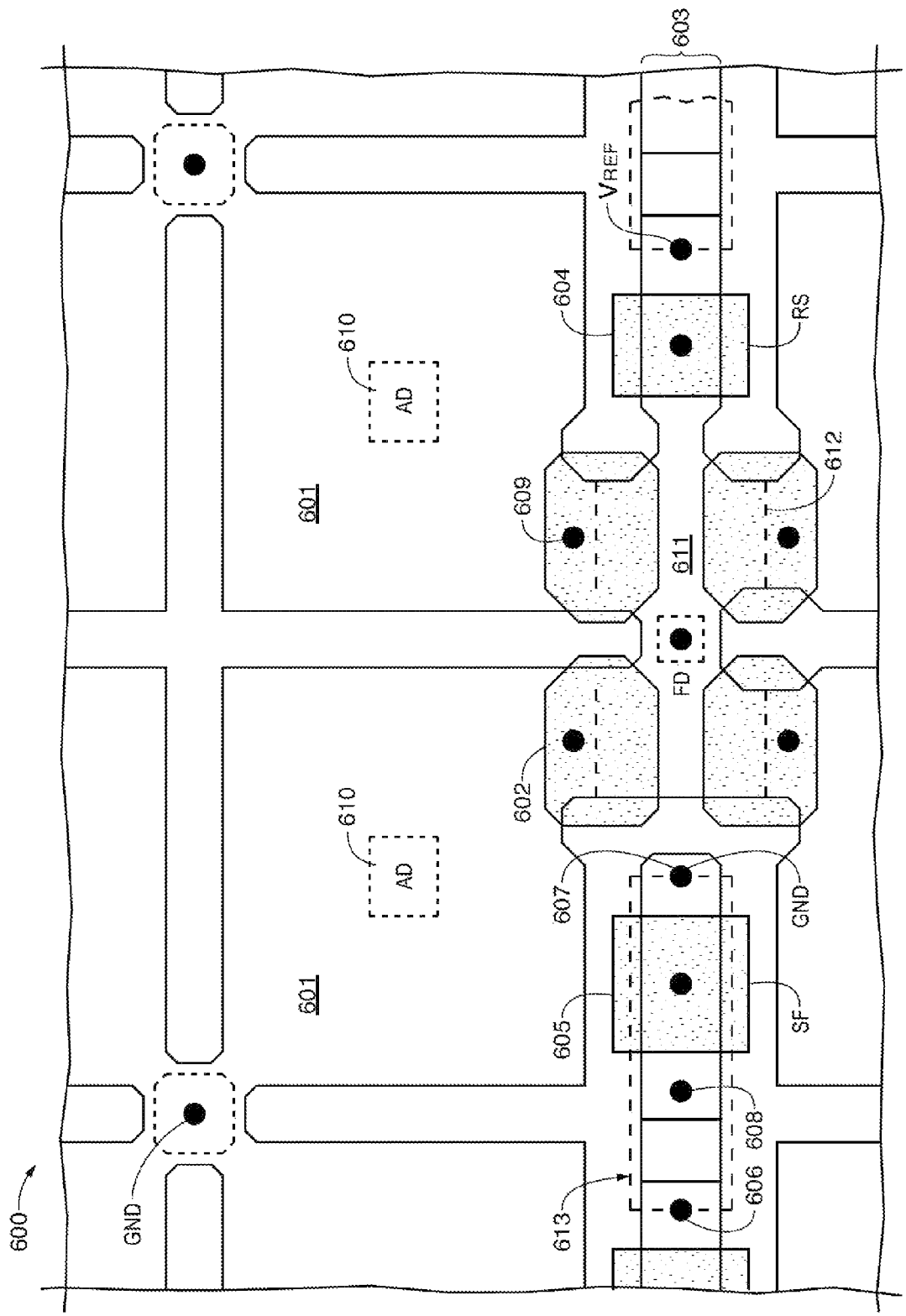
FIG. 6 is an illustrative layout diagram of four photodiodes with corresponding charge transfer gates per shared floating diffusion region pixel topology, in which the p-channel MOSFET source follower transistor and the n-channel MOSFET reset transistor are located in an shallow trench isolation (STI) trunk between photodiode rows in accordance with an embodiment of the present invention.

In another suitable arrangement, the pixel may be provided with four photodiodes with corresponding charge transfer gates that share a common floating diffusion node. FIG. 6 is an illustrative pixel layout diagram showing a simplified top view of a 4-way shared photodiode pixel topology 600. The active photodiode region is shown by region 601 and has anti-dome (AD) implant and the RPW compensating opening region 610 located approximately in the center of the pixel photodiode region. Region 601 may be isolated from similar regions of the neighboring pixels by STI isolation regions. However, other types of pixel isolation, such as the suitable implants or deep trench isolation (DTI) may be used. The charge transfer gates are shown by regions 602 that interface with the n+ type doped floating diffusion region 611. The transfer gates may have regions 612 implanted underneath, which form charge wells that improve the charge transfer efficiency. The n-channel MOSFET reset transistor and the p-channel MOSFET source follower transistor are placed in the ST1 isolated trunk region 603. The p+ type doped MOSFET source follower transistor source and the drain are shown by regions 607 and 608, respectively. Region 607 may be connected to the pixel ground.

In the example of FIG. 6, the p-channel MOSFET source follower transistor gate is shown by region 605. Similarly the n-channel MOSFET reset transistor has an n+ type doped source region 606 and a drain region that is common (shared) with floating diffusion region 611. The n-channel MOSFET reset transistor gate is shown by region 604. The associated pixel wiring has been omitted for the sake of simplicity. However, contact via placements 609 are indicated by dark circles. The mask for forming the fully depleted or only the partially depleted mini n-well is indicated by the region bounded by the dashed line 613. The main advantage of this 4-way shared photodiode layout relative to conventional sensors is the less stringent requirement for corresponding transistor design rules and a larger photodiode charge storage capacity.

Figure 7:
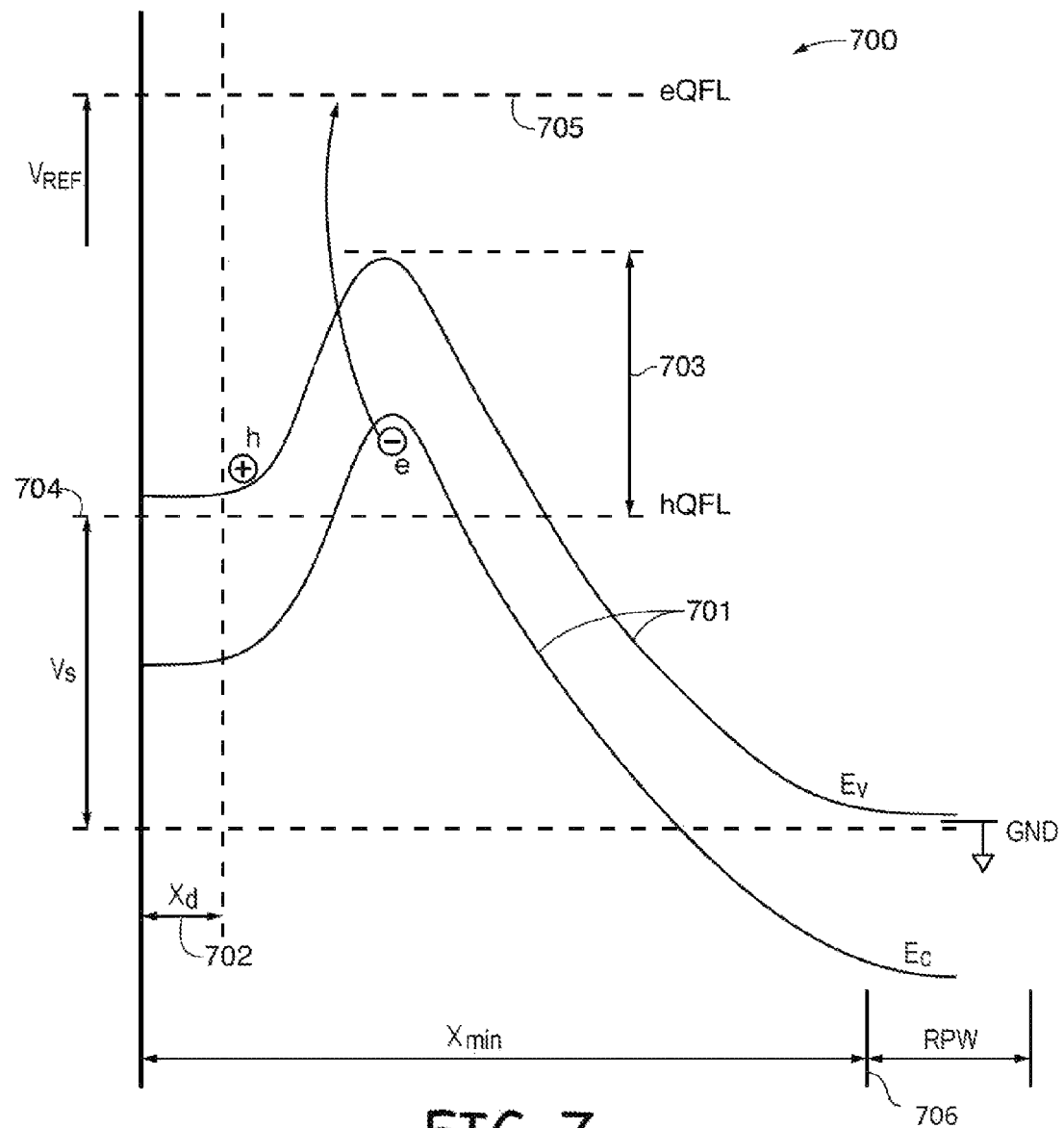
FIG. 7 is an illustrative diagram showing the bias potentials and energy band diagrams in a fully depleted mini n-well region under the p-channel MOSFET source follower transistor of the type shown in FIGS. 2-6 in accordance with an embodiment of the present invention.

For the sake of completeness, FIG. 7 shows an illustrative diagram of the potentials and energy bands within the fully depleted mini n-well under the source terminal of the p-channel MOSFET source follower transistor. Diagram 700 represents various bias potentials and the potential barrier for holes in the mini n-well region. The simplified energy band diagram under the transistor source terminal is represented by curves 701. The transistor source junction depth is indicated as Xj 702. The n− type doped implant in the mini n-well is used to form only a potential barrier for holes 703, thereby forcing holes to flow from the source along the transistor channel (perpendicular to the drawing plane of the figure) to a drain biased at the ground potential. The sufficiently high barrier thus prevents shorting of the transistor source to ground (the RPM region). The voltage level appearing on the transistor source when a current bias is applied is shown as a Quasi Fermi level potential for holes Vs 704. The reference bias for the mini n-well is indicated by the Quasi Fermi level potential for electrons Vref 705. The mini n-well depth is indicated as the region Xmn 706. The approximately constant depth of the mini n-well fully depleted region and its relatively large value in comparison to the gate oxide thickness guaranties linearity of the source follower and a high, near unity, gain of the source follower buffer. It is thus clear that incorporation of the fully depleted mini n-well does not present any problems for the pixel, does not occupy any additional valuable pixel area, and does not causes any problems such as the injection of electrons or generation of additional dark current that would add to the photodiode dark current and thus degrade the sensor performance. The mini n-well may also be only partially depleted of mobile charge.

In some scenarios, it may be advantageous not to use a p-channel MOSFET transistor for the source follower, which requires incorporation of the mini n-well into the pixel. In such an arrangement, a p-channel JFET transistor may be used as the source follower transistor and may be placed directly into the floating diffusion charge detection node. The JFET transistor has no RTS noise, has a reasonable Gm, has a suitable threshold voltage, and in this implementation has a near unity voltage gain.

Figure 8:
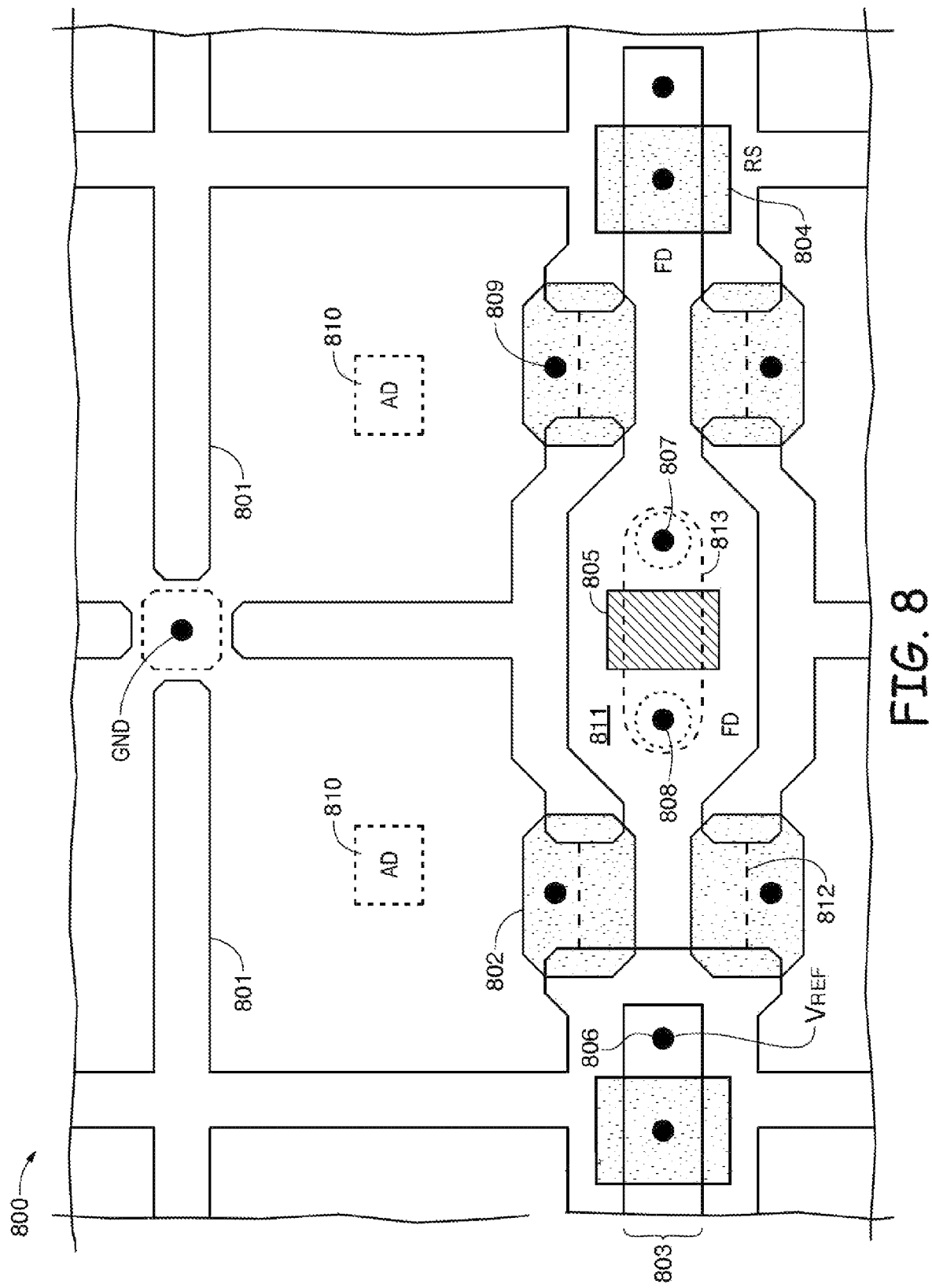
FIG. 8 is an illustrative layout diagram of a four photo-diodes with corresponding charge transfer gates per shared floating diffusion region pixel topology, in which pixel source follower transistor is a p-channel junction gate field-effect transistor (JFET) located directly within the floating diffusion charge detection region in accordance with an embodiment of the present invention.

FIG. 8 shows an illustrative layout diagram of this modification to the pixel topology. As shown in FIG. 8, pixel topology 800 represents the simplified top view of the 4-way shared photodiode pixel. The active photodiode region is shown by region 801 and may include anti-dome (AD) implant and the RPW compensating opening regions 810 located approximately in the center of the pixel photodiode. Photodiode region 801 may be isolated from similar regions of the neighboring pixels by the STI isolation regions. However, other types of pixel isolation, such as the suitable implants or deep trench isolation (DTI) may be used.

The charge transfer gates are shown by regions 802 that interface with the n– type doped floating diffusion region 811. The transfer gates may have regions 812 implanted underneath, which form the charge wells that improve the charge transfer efficiency. The n-channel MOSFET reset transistor may be placed in the STI isolated trunk region 803. The p+ type doped JFET source follower transistor source and the source follower drain regions may be formed under the contact via 807 and 808, respectively. The region 807 may be connected to pixel ground. The JFET source follower transistor gate is shown by n+ type doped region 805 whereas the JFET p– type doped channel is shown by region 813. The JFET source follower gate region 805 is conductively coupled to floating diffusion region 811 by its overlapping diffusion without any need for a wire connection. This is also an advantage of the layout of FIG. 8, which reduces parasitic couplings of unwanted signals into the floating diffusion charge detection node. The n-channel MOSFET reset transistor has an n+ type doped source region 806. The drain region of the n-channel MOSFET reset transistor may be shared with floating diffusion region 811. The reset transistor gate is shown by region 804. The associated pixel wiring has been omitted for the sake of simplicity, whereas contact via placements 809 are indicated by dark circles in FIG. 8.

In another suitable arrangement, the p-channel JFET source follower transistor can be arranged in a vertical direction. An example of a vertical arrangement of this type is described in detail in Hynecek (U.S. Patent Publication No. 2013/0146747), which is incorporated herein by reference.

In this way, several possible arrangements of a compact submicron pixel layout may be formed that include a p-channel MOSFET source follower transistor or a p-channel JFET source follower transistor, and an n-channel MOSFET reset transistor without the need for a pixel row addressing transistors, thereby minimizing area consumption in the pixel (e.g., allowing for improved charge capacity and dynamic range relative to conventional pixels). The described details in this disclosure are thus intended to be illustrative and not limiting. It is noted that persons skilled in the art can make modifications and variations in light of the above teachings. For example, it is understood that the polarity type of all the dopants and the substrate can be inverted and the pixels can contain a p-channel MOSFET reset transistor, an n-channel JFET source follower transistor or an n-channel MOSFET source follower transistor placed in a mini p-well. It is therefore to be understood that changes may be made in the particular embodiments of the invention disclosed, which are within the scope and spirit of the invention.

Figure 9:
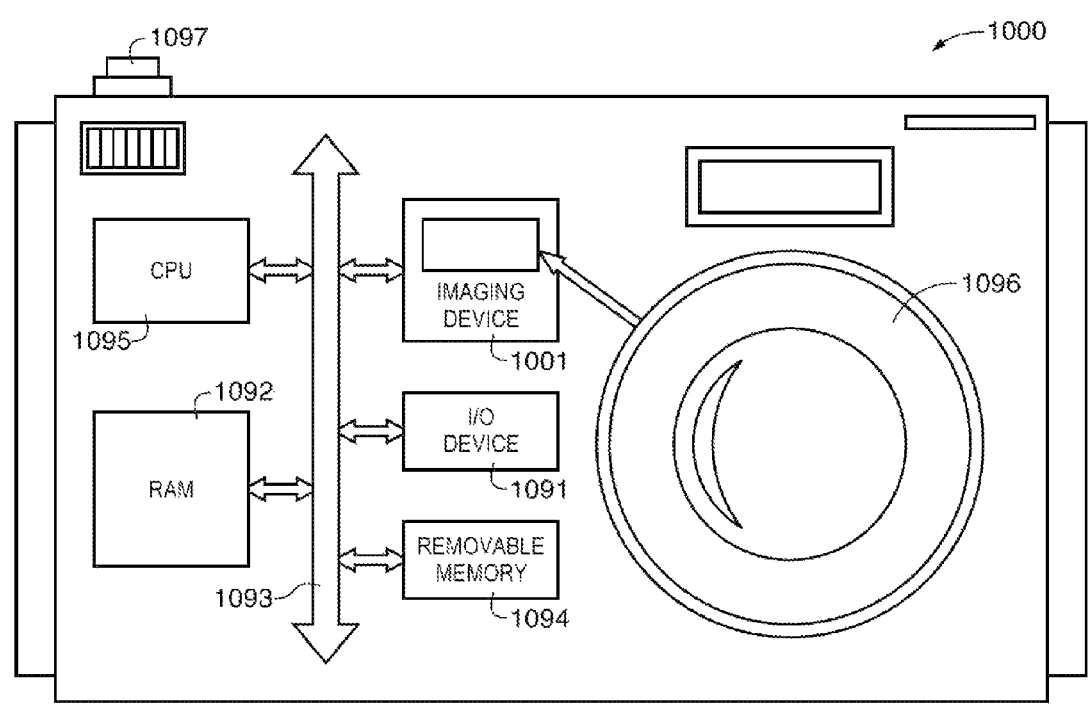
FIG. 9 is a block diagram of a processor system employing the image sensor pixels of FIGS. 2-8 in accordance with an embodiment of the present invention.

FIG. 9 shows in simplified form a typical processor system 10, such as a digital camera, which includes an imaging device such as imaging device 1001 (e.g., an imaging device 1001 such as an image sensor that includes image sensor pixels as described above in connection with FIGS. 1-8). Processor system 1000 is exemplary of a system having digital circuits that could include imaging device 1001. Without being limiting, such a system could include a computer system, still or video camera system, scanner, machine vision, vehicle navigation, video phone, surveillance system, auto focus system, star tracker system, motion detection system, image stabilization system., and other systems employing an imaging device.

Processor system 1000, which may be a digital still or video camera system, may include a lens such as lens 1096 for focusing an image onto a pixel array when shutter release button 1097 is pressed. Processor system 1000 may include a central processing unit such as central processing unit (CPU) 1095. CPU 1095 may be a microprocessor that controls camera functions and one or more image flow functions and communicates with one or more input/output (I/O) devices 1091 over a bus such as bus 1093. Imaging device 1001 may also communicate with CPU 1095 over bus 1093. System 1000 may include random access memory (RAM) 1092 and removable memory 1094. Removable memory 1094 may include flash memory that communicates with CPU 1095 over bus 1093. Imaging device 1001 may be combined with CPU 1095, with or without memory storage, on a single integrated circuit or on a different chip. Although bus 1093 is illustrated as a single bus, it may be one or more buses or bridges or other communication paths used to interconnect the system components.

Various embodiments have been described illustrating an imaging system (e.g., image sensor pixel array) having pixels without corresponding addressing transistors to allow for increased photodiode capacity and dynamic range relative to conventional imaging systems. The array may include a number of image sensor pixels arranged in rows and columns.

Each image sensor pixel in the array may be formed on a semiconductor substrate. The image sensor pixel may include a photodiode region that generates charge in response to image light, a floating diffusion region, and a charge transfer transistor configured to transfer the generated charge from the photodiode region to the floating diffusion region. The image sensor pixel may include an n– type doped well region in the semiconductor substrate and a p-channel metal-oxide-semiconductor (MOS) source follower transistor formed within the n– type well region on the semiconductor substrate. The p-channel MOS source follower transistor may have a gate terminal coupled to the floating diffusion region and a source terminal coupled to a column readout line. An n-channel MOS reset transistor may be coupled between the floating diffusion region and a bias voltage column line and may be configured to reset the floating diffusion region to a reset voltage. In another suitable arrangement, the pixel may include a p– type doped well region, an n-channel MOS source follower transistor formed within the p– type well region, and a p-channel MOS reset transistor.

A drain terminal of the n-channel MOS reset transistor may overlap with the n– type doped well region on the semiconductor substrate so that the bias voltage is provided to the n– type doped well region without wiring. The drain terminal of the n-channel MOS reset transistor may form a part of the floating diffusion region. The pixel may include any desired number of photodiodes coupled to the floating diffusion region (e.g., that share the floating diffusion region) through respective charge transfer transistors. For example, each pixel may include two or four photodiodes that share a floating diffusion region.

If desired, a p+ type retrograde doped layer may be formed under the photodiode region and connected to a reference terminal. The p+ type retrograde doped layer may have an opening formed by a compensating implant having an opposite polarity with respect to the p+ type retrograde doped layer. The p+ type retrograde doped layer may extend under the n– type doped well region and the floating diffusion region in the substrate to form a potential barrier that is configured to isolate the n– type doped well region and the floating diffusion region from a bulk portion of the semiconductor substrate by preventing photo-generated electrons from entering the n– type doped well region and the floating diffusion region from the bulk portion of the semiconductor substrate. The semiconductor substrate may have a front surface and an opposing back surface, the column readout line may be coupled to the source terminal of the p-channel MOS source follower transistor at the front surface, and the photodiode may be configured to generate the charge in response to image light received through the back surface. In another suitable arrangement, the photodiode may be configured to generate the charge in response to light received through the front surface (e.g., the pixel array may include a number of corresponding microlenses and color filter elements formed over the back surface when the array is back side illuminated and over the front surface when the array is front side illuminated).

In another suitable arrangement, the image sensor pixel may include a p-channel junction gate field-effect (JFET) source follower transistor formed within the floating diffusion region on the semiconductor substrate and an n-channel JFET reset transistor coupled to the floating diffusion region and that is configured to reset the floating diffusion region to a reset voltage. In another suitable arrangement, an n-channel JFET source follower transistor and a p-channel JFET reset transistor may be formed.

A column readout line may be coupled to a source terminal of the p-channel JFET source follower transistor and a ground terminal may be coupled to a drain terminal of the p-channel JFET source follower transistor. The n-channel JFET reset transistor may be coupled between the floating diffusion region and a voltage bias column line. The p-channel JFET source follower transistor may have an n+ type doped gate region that is surrounded by the floating diffusion region on the semiconductor substrate and a p– type doped channel region formed below the n+ type doped gate region. The n+ type doped gate region of the p-channel JFET source follower transistor may be electrically coupled to the floating diffusion region without a conductive wire. A p+ type retrograde doped layer may be formed under the photodiode region and connected to a ground terminal. The p+ type retrograde doped layer may include an opening formed by a compensating implant having an opposite polarity with respect to the p+ type retrograde doped layer. The p+ type retrograde doped layer may extend under the floating diffusion region to form a potential barrier that is configured to isolate the floating diffusion region from a bulk portion of the semiconductor substrate by preventing photo-generated electrons from entering the floating diffusion region from the bulk portion of the semiconductor substrate.

If desired, the polarities of the doping in the semiconductor substrate on which the image sensor pixels are formed may be reversed. The image sensor pixels may be submicron in size, may include low RTS noise, and may be operated using robust pixel addressing without the need for row select transistors, thereby conserving space consumption on the pixel substrate, allowing for increased photodiode area and dynamic range in the final image. The pixels may be formed in a system that also includes a central processing unit, memory, input-output circuitry, and a lens.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor pixel formed on a semiconductor substrate, comprising:
    a photodiode region that generates charge in response to image light;
    a floating diffusion region;
    a charge transfer transistor configured to transfer the generated charge from the photodiode region to the floating diffusion region;
    an n-type doped well region in the semiconductor substrate;
    a p-channel metal-oxide-semiconductor (MOS) source follower transistor formed within the n-type well region on the semiconductor substrate, wherein the p-channel MOS source follower transistor has a gate terminal coupled to the floating diffusion region and a source terminal coupled to a column readout line;
    an n-channel MOS reset transistor coupled between the floating diffusion region and a bias voltage column line that is configured to reset the floating diffusion region; and
    a p+ type retrograde doped layer formed under the photodiode region and connected to a reference terminal, wherein the p+ type retrograde doped later has an opening formed by a compensating implant having an opposite polarity with respect to the p+ type retrograde doped layer.

2. The image sensor pixel defined in claim 1, wherein a drain terminal of the n-channel MOS reset transistor overlaps with the n-type doped well region on the semiconductor substrate so that the bias voltage is provided to the n-type doped well region.

3. The image sensor pixel defined in claim 1, further comprising:
    a least one additional photodiode, wherein the at least one additional photodiode is configured to transfer generated charge to the floating diffusion region.

4. The image sensor pixel defined in claim 1, further comprising:
    at least three additional photodiodes, wherein the at least three additional photodiodes are configured to transfer generated charge to the floating diffusion region and wherein the n-channel MOS reset transistor has a drain terminal that forms a part of the floating diffusion region.

5. The image sensor pixel defined in claim 1, wherein the p+ type retrograde doped layer extends under the n-type doped well region and the floating diffusion region to form a potential barrier that is configured to isolate the n-type doped well region and the floating diffusion region from a bulk portion of the semiconductor substrate by preventing photo-generated electrons from entering the n-type doped well region and the floating diffusion region from the bulk portion of the semiconductor substrate.

6. The image sensor pixel defined in claim 1, wherein the image sensor pixel is formed as a part of an image sensor pixel array on the semiconductor substrate, the image sensor pixel further comprising:
  pixel isolation structures selected from a group consisting of: shallow trench isolation regions and deep trench isolation regions, wherein the pixel isolation structures are configured to isolate the image sensor pixel from other image sensor pixels in the array.

7. The image sensor pixel defined in claim 1, wherein the image sensor pixel is formed as a part of an image sensor pixel array on the semiconductor substrate, the image sensor pixel further comprising:
  impurity implant portions in the semiconductor substrate that are configured to isolate the image sensor pixel from other image sensor pixels in the array.

8. The image sensor pixel defined in claim 1, wherein the semiconductor substrate has a front surface and an opposing back surface, wherein the column readout line is coupled to the source terminal of the p-channel MOS source follower transistor at the front surface and the photodiode is configured to generate the charge in response to image light received through the back surface.

9. The image sensor pixel defined in claim 8, further comprising:
  a plurality of microlenses and color filter elements formed over the back surface of the semiconductor substrate.

10. The image sensor pixel defined in claim 1, wherein the semiconductor substrate has a front surface and an opposing back surface, wherein the column readout line is coupled to the source terminal of the p-channel MOS source follower transistor at the front surface and the photodiode is configured to generate the charge in response to image light received through the front surface.

11. The image sensor pixel defined in claim 10, further comprising:
  a plurality of microlenses and color filter elements formed over the front surface of the semiconductor substrate.

12. An image sensor pixel formed on a semiconductor substrate, comprising:
  a photodiode region that generates charge in response to image light;
  a floating diffusion region;
  a charge transfer transistor configured to transfer the generated charge from the photodiode region to the floating diffusion region;
  a p-channel junction gate field-effect (JFET) source follower transistor formed within the floating diffusion region on the semiconductor substrate, wherein the p-channel JFET source follower transistor has an n+ type doped gate region that is surrounded by the floating diffusion region on the semiconductor substrate and p-type doped channel region formed below the n+ type doped gate region; and
  an n-channel JFET reset transistor coupled to the floating diffusion region and that is configured to reset the floating diffusion region to a reset voltage.

13. The image sensor pixel defined in claim 12, further comprising:
  a column readout line coupled to a source terminal of the p-channel JFET source follower transistor; and
  a ground terminal coupled to a drain terminal of the p-channel JFET source follower transistor.

14. The image sensor pixel defined in claim 12, wherein the n-channel JFET reset transistor is coupled between the floating diffusion region and a voltage bias column line.

15. The image sensor pixel defined in claim 12, wherein the n+ type doped gate region of the p-channel JFET source follower transistor is electrically coupled to the floating diffusion region without a conductive wire.

16. The image sensor pixel defined in claim 12, further comprising:
  a p+ type retrograde doped layer formed under the photodiode region and connected to a ground terminal, wherein the p+ type retrograde doped layer has an opening formed by a compensating implant having an opposite polarity with respect to the p+ type retrograde doped layer, and wherein the p+ type retrograde doped layer extends under the floating diffusion region to form a potential barrier that is configured to isolate the floating diffusion region from a bulk portion of the semiconductor substrate by preventing photo-generated electrons from entering the floating diffusion region from the bulk portion of the semiconductor substrate.

17. A system, comprising:
a central processing unit;
memory;
input-output circuitry; and
an imaging device, wherein the imaging device comprises:
  a pixel array having at least one pixel circuit, and
  a lens that focuses an image onto the pixel array, wherein the at least one pixel circuit comprises:
    a photodiode region that generates charge in response to image light;
    a floating diffusion region;
    a charge transfer transistor configured to transfer the generated charge from the photodiode region to the floating diffusion region;
    an n-channel junction gate field-effect (JFET) source follower transistor formed within the floating diffusion region on the semiconductor substrate, wherein the n-channel JFET source follower transistor has a p+ type doped gate region that is surrounded by the floating diffusion region on the semiconductor substrate and an n-type doped channel region formed below the p+ type gate region; and
    a p-channel JFET reset transistor coupled to the floating diffusion region and that is configured to reset the floating diffusion region to a reset voltage.

18. The image sensor pixel defined in claim 17, wherein the p+ type doped gate region of the n-channel JFET source follower transistor is electrically coupled to the floating diffusion region without a conductive wire.

\* \* \* \* \*